United States Patent
Mihara

[11] Patent Number: 6,080,945
[45] Date of Patent: Jun. 27, 2000

[54] CONTROL SWITCH FOR AN AUTOMATIC VEHICLE TRANSMISSION

[75] Inventor: Haruhiko Mihara, Tsu, Japan

[73] Assignee: Matsushita Electric Works, Ltd., Osaka, Japan

[21] Appl. No.: 09/123,545

[22] Filed: Jul. 28, 1998

[30] Foreign Application Priority Data

Jul. 31, 1997 [JP] Japan ................................ 9-206794

[51] Int. Cl.⁷ ................................................ H01H 19/14
[52] U.S. Cl. ............................ 200/61.91; 200/61.88; 200/564; 200/570; 200/571
[58] Field of Search ................ 74/334, 335; 192/3.58; 200/11 R–11 H, 61.27, 61.28, 61.85, 61.86, 61.88, 61.91, 564, 565, 570, 571, 332, 336, 293; 307/9.1, 10.1; 340/456, 457; 477/86, 99

[56] References Cited

U.S. PATENT DOCUMENTS

| | | | |
|---|---|---|---|
| 4,921,124 | 5/1990 | Stammler et al. | 220/367 |
| 5,525,768 | 6/1996 | Cobb, III et al. | 200/61.88 |
| 5,577,605 | 11/1996 | Dilly et al. | 200/564 |
| 5,679,937 | 10/1997 | Iwata | 200/61.88 |
| 5,693,925 | 12/1997 | Yamada et al. | 200/61.88 |
| 5,762,183 | 6/1998 | Iwata | 200/571 |
| 5,828,022 | 10/1998 | Nakazawa et al. | 200/61.88 |

FOREIGN PATENT DOCUMENTS

| | | | |
|---|---|---|---|
| 0763677 | 3/1997 | European Pat. Off. | F16H 59/10 |
| 3707050 | 9/1988 | Germany | H01H 9/04 |
| 19600786 | 7/1997 | Germany | H01H 19/02 |

*Primary Examiner*—Michael Friedhofer
*Attorney, Agent, or Firm*—Greenblum & Bernstein, P.L.C.

[57] ABSTRACT

A control switch for an automatic vehicle transmission comprises a movable body turning in association with an operation of a gearshift lever of the automatic vehicle transmission provided in an automobile and a housing storing the movable body and having fixed contacts to be brought in and out of touch with movable contacts in consequence of the turn of the movable body. The control switch indicates a shift position of the automatic vehicle transmission in accordance with a position of the fixed contacts. Wherein a ventilation hole communicating interior to exterior of the housing is opened at a face at a side of the housing where the housing is mounted to the automobile.

15 Claims, 11 Drawing Sheets

CONTROL SWITCH FOR AN AUTOMATIC VEHICLE TRANSMISSION

BACKGROUND OF THE INVENTION

1. Field of the Invention

The present invention relates to a control switch for an automatic vehicle transmission and, more particularly, to the control switch which generates, one at a time, position signals indicating respective gear positions of a gearshift lever employed in an automatic vehicle transmission.

2. Description of the Related Art

An automatic vehicle transmission is generally provided with a gearshifting manual shaft that is driven by a gearshift lever. A control switch for detecting the position of the transmission is arranged in the vicinity of the manual shaft so that an electric position signal indicative of one of the gear positions selected by the gearshift lever can be generated therefrom. The position signals that can be generated by the control switch one at a time may include those associated with, for example, parking, reverse, neutral, drive, second, low or the like. The position signal is supplied to a microcomputer of a control system to allow the latter to control various displays and also to control the status of the transmission.

Figure 17A:
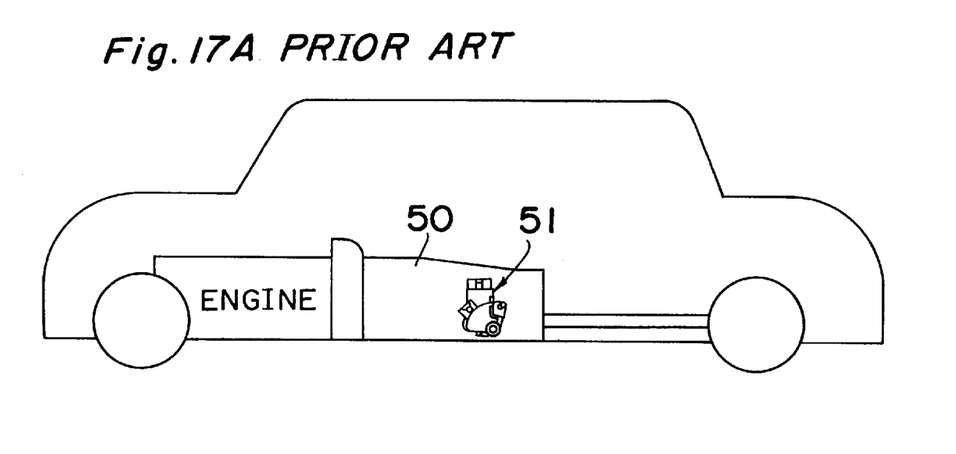
FIG. 17A is a schematic side view of the automobile body.
Figure 17B:
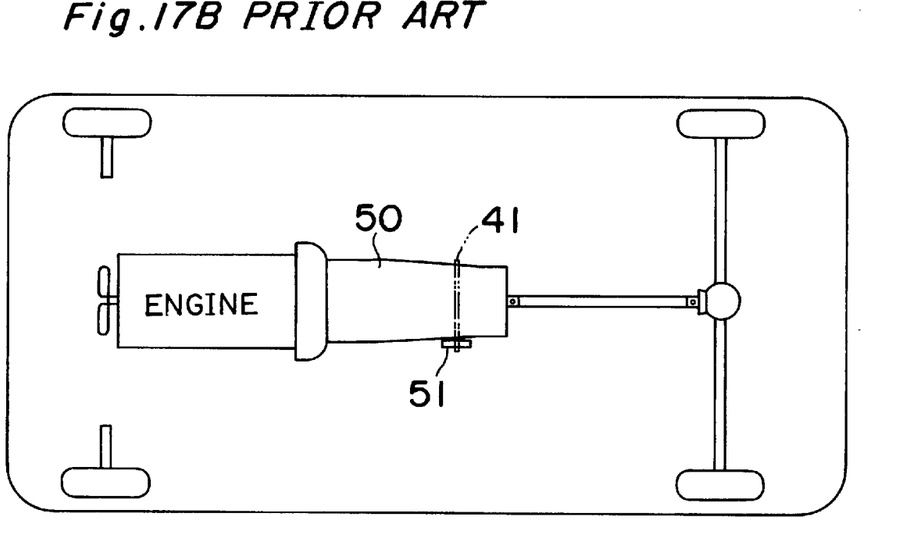
FIG. 17B is a schematic bottom view of the automobile body.

The control switch of the above-described type comprises a housing 51 consisting of a case 51a formed by die-casting aluminum and a base substrate 51b molded of a synthetic resin, as shown in FIGS. 14A to 16. The housing 51 is mounted, as illustrated in FIGS. 17A and 17B, on the transmission 50 with the base substrate 51b held in contact with the transmission 50. A movable body 60 is rotatabley accommodated inside the housing 51 and coupled with a manual shaft 41 that is rotatable in response to movement of a gearshift lever. Therefore, the movable body 60 rotates together with the manual shaft 41 and, hence, in response to the gearshifting of the gearshift lever.

The movable body 60 has a tubular boss 61, to which the manual shaft 41 is coupled for movement together therewith, and a movable element 62 coupled with one point of an outer circumferential face of the tubular boss 61 so as to project in a diametrical direction. The movable element 62 turns following the turn of the tubular boss 61 within a space defined by a recess 52, formed in an inside face of the case 51a, and the base substrate 51b. A plurality of movable contacts 63 are set on a face of the moving element 62 opposed to the base substrate 51b. The movable contacts 63 are urged towards the base substrate 51b by springs 64. Moreover, substantially arcuate band-shaped fixed contacts 54a and 54b are arranged at the base substrate 51b about the center of turn of the movable body 60. The fixed contacts 54a correspond to respective shift positions such as parking, reverse, etc., and the fixed contact 54b is common to all of those fixed contacts 54a and engageable with any one of those fixed contacts 54a as will be become clear from the subsequent description.

When the movable body 60 turns, the common contact 54b is electrically connected with one of the fixed contacts 54a via the movable contacts 63. The position to which the movable body 60 has been turned can be detected in terns of which one of the fixed contacts 54a is connected with the movable contacts 63. In other words, when the manual shaft 41 in the transmission 50 is turned in response to gearshifting of the gearshift lever, the movable body 60 turns together with the manual shaft 41 with the movable contact 63 consequently bridging between one of the fixed contacts 54a and the common contact 54b to thereby generate a position signal corresponding to the position of the shift lever in the transmission 50. In the illustrated example, when the movable contacts 63 are in position to connect one of the fixed contacts 54a, corresponding either the parking position or the neutral position, and the common contact 54b, a power feed route is formed from a battery to a starter circuit through an ignition switch.

The transmission 50 is disposed in an engine room or at a lower part of au automobile body (or under the body) and consequently the control switch fitted in a manner to butt against ATM 50 is exposed to waiter, mud, dust, etc., and the control switch is thus required to be waterproof Meanwhile, the control switch tends to be heated to 100° C. or higher as it is mounted in a fashion held in contact with the transmission 50, whereby a high atmospheric pressure difference is brought about between inside and outside the casing 51 if the housing 51 is sealed, which acts a stress and easily breaks the housing 51. In order to prevent the atmospheric pressure difference, a ventilation hole 70 is formed in the housing 51.

The ventilation hole 70 is formed in the case 51a, which is placed at an upper part of the housing 51 when the housing 51 is mounted on the transmission 50, with an aim to avoid the water and mud. The reason that the ventilation hole 70 is formed in the case 51a is because it is more reliable about waterproof properties to provide the hole 70 in the case 51a made of a metal than to provide the hole 70 in the main body substrate 51b made of a synthetic resin. Moreover, the ventilation hole 70 is equipped with a filter 71 (See FIG. 8A and 8B) using a waterproof gas-permeable material (e.g., material by the trade name GoreTex), thereby being water-resistant. If the housing at a high temperature is suddenly cooled by water, a negative pressure would develop inside the housing 51 to such an extent as to allow water to be sucked into the housing 51. The filter 71 is set to the ventilation hole to prevent the water from entering even under the above situation.

Figure 18:
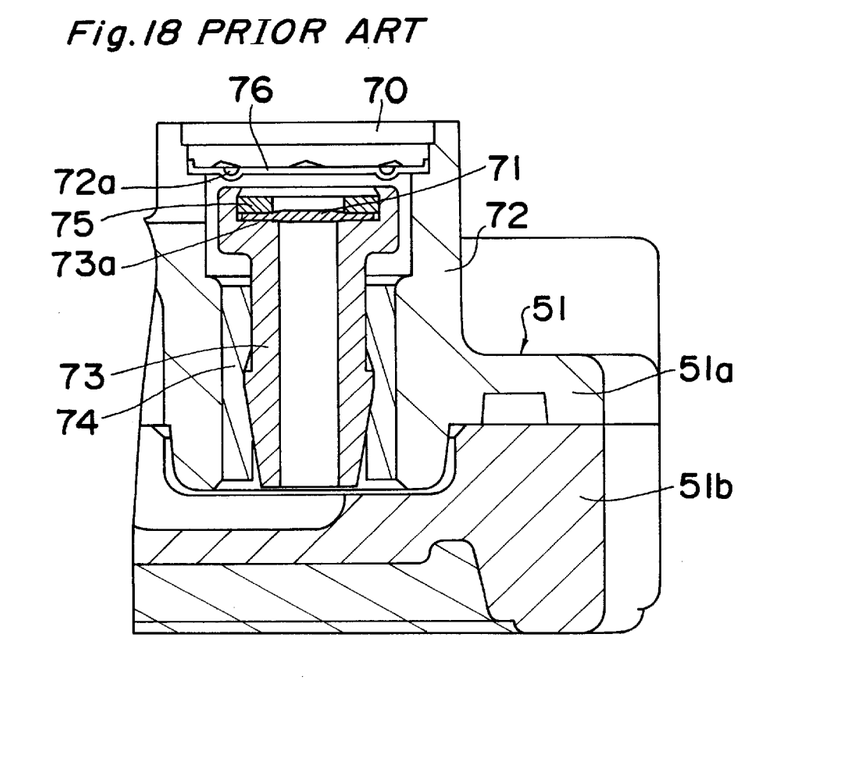
FIG. 18 is a sectional view of a ventilation hole in the control switch.
Figure 19:
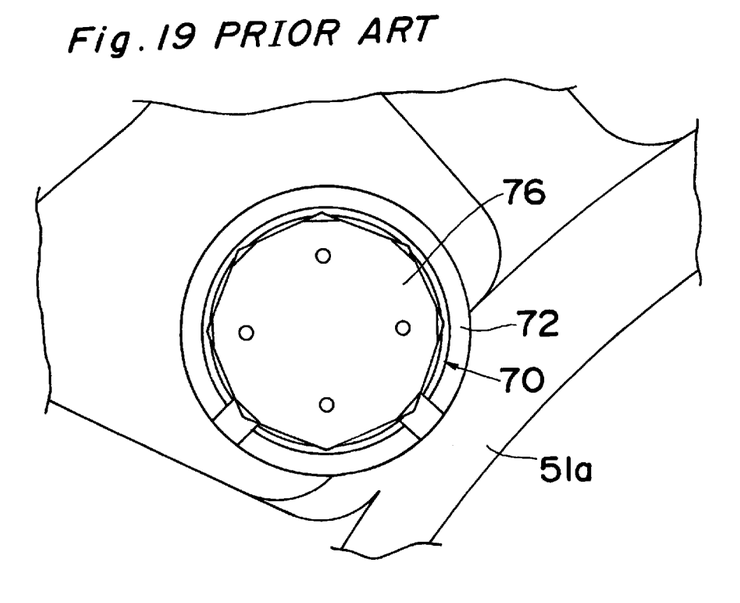
FIG. 19 is a front view of the ventilation hole.

The case 51a in which the ventilation hole 70 is formed is metallic and constructed in a structure shown in FIGS. 18 and 19 to hold the filter 71. More specifically, a metallic cylindrical body 73 is inserted into a cylindrical part 72 which is provided in the case 51a in communication with the space between the recess 52 of the case 51a and the base substrate 51b, thereby holding the filter 71. A rubber seal 74 is interposed between an inner circumferential face of the cylindrical part 72 and an outer circumferential face of the cylindrical body 73 to water-tightly couple the cylindrical part 72 and cylindrical body 73. The cylindrical body 73 has a step part 73a at one end part thereof The step part 73a is of a larger diameter at the side of an opening of the cylindrical body 73. A washer 75 is fitted to the step part 73a via the filter 71. The filter 71 is secured to the cylindrical body 73 via the washer 75 by compressing the opening of the cylindrical body 73. Further, a step part 72a is formed at an opening part of the cylindrical part 72, which has a larger diameter at the side of the opening part. A protecting cap 76 is pressed into the step part 72a.

In the above-described constitution, since the ventilation hole 70 is opened to the side opposite to the transmission 50, the ventilation hole 70 is exposed outside when the housing is mounted to the automobile and prone to be affected by water and mud. In spite of the waterproof structure as discussed hereinabove, an insulation failure is highly probably brought about due to the invasion of water into the housing 51. If the water enters the housing 51, it is difficult to discharge the water outside the housing 51 because the ventilation hole 70 is located at the upper part of the housing 51.

Besides, the ventilation hole 70 requires the cylindrical body 73, rubber seal 74, washer 75 and protecting cap 76 in addition to the filter 71, that is, five parts in total. In other words, the increased count of parts invites a cost rise. The metallic cylindrical body 73 is partly caulked so as to secure the washer 75 holding the filter 71 and therefore, waterproof efficiency between the washer 75 and filter 71 is varied. Whether or not the filter 71 is held enough at the periphery thereof cannot be confirmed directly. Although an air pressure can be impressed to the filter 71 in order to confirm the water-tight properties at the periphery of the filter 71 in a state fitted to the cylindrical body 73 thereby shutting an opening part of the washer 75, the washer 75 comes to tightly adhere to the filter 71 when the opening part of the washer is pressed strong even if the cylindrical body 73 is not caulked enough. In that case, the ventilation hole is incorrectly recognized as good during inspection. Two waterproof structures required by the ventilation hole to the filter 71 and rubber seal 74 decrease reliability in waterproof performance. The rubber seal 74 particularly accompanies a creep because of heat, thereby lowering the waterproof efficiency of the ventilation hole.

SUMMARY OF THE INVENTION

The basic object of the present invention is therefore to provide an improved control switch for an automatic vehicle transmission which eliminates the above described various problems in the prior art.

In order to achieve the aforementioned objects, according to one aspect of the present invention, there is provided a control switch for an automatic vehicle transmission comprising a movable body turning in association with an operation of a gearshift lever of the automatic vehicle transmission provided in an automobile, and a housing storing the movable body and having fixed contacts to be brought in and out of engagement with movable contacts in response to the turn of the movable body thereby indicating a shift position of the automatic vehicle transmission in accordance with a position of the fixed contacts, wherein a ventilation hole communicating interior to exterior of the housing is opened at a face at a side of the housing where the housing is mounted to the automobile.

It is preferred that the housing comprises a main body substrate made of a synthetic resin and providing a mount face to the automobile, and a metallic case forming a space in cooperation with the main body substrate for accommodating the movable body therein, wherein the ventilation hole is opened in the main body substrate. In this case, ventilation hole is preferably provided in the vicinity of a lower end part of the housing in a state that the control switch is mounted to the automobile.

It is also preferred that the ventilation hole comprises a step part which has a larger diameter at an opening side, so that a peripheral part of a filter of gas-permeable waterproof material is held between a gas-permeable cap inserted in the ventilation hole and the step part. In this case, the cap is preferably molded of a synthetic resin, having at least an outer circumferential face being thermocompression bonded with the use of ultrasonic waves to an inner circumferential face of the ventilation hole inside the ventilation hole.

It is also preferred that the cap has a cylindrical recess at a central part opposite to the filter and is so shaped that ventilation ports are opened at the opening side of the ventilation hole to communicate to the recess.

Advantageously, the ventilation port is a long arc hole curved in a circumferential direction of the cap and provided by a plurality of counts via an equal distance.

It is also preferred that a large hole part and a small hole part are formed between an opening face and the step part of the ventilation hole so that a diameter of the large hole part at the side of the opening face is larger, while the cap has a large diameter part to be inserted in the large hole part and a small diameter part to be inserted in the small hole part, with a circumferential wall of the small hole part of the ventilation hole being thermocompression bonded with ultrasonic waves to the large diameter part of the cap, the control switch further characterized in that a gap between the large hole part and large diameter part is set larger than that between the small hole part and small diameter part.

Conveniently, a notch is formed at least at one point of an inner circumferential face of the small hole part of the ventilation hole in a direction parallel to a center line of the ventilation hole. It is also preferred that the cap is disposed at an inner side than the opening face of the ventilation hole.

BRIEF DESCRIPTION OF THE DRAWINGS

These and other objects and features of the present invention will become clear from the following description taken in conjunction with a preferred embodiment thereof and the accompanying drawings throughout which like parts are designated by like reference numerals, and in which.

DETAILED DESCRIPTION OF THE PREFERRED EMBODIMENT

This application is based on a patent application No. HEI 9-206794 filed in Japan, the content of which is incorporated herein by reference.

The embodiment according to the present invention is described below in conjunction with FIGS. 1 to 13B.

Figure 1:
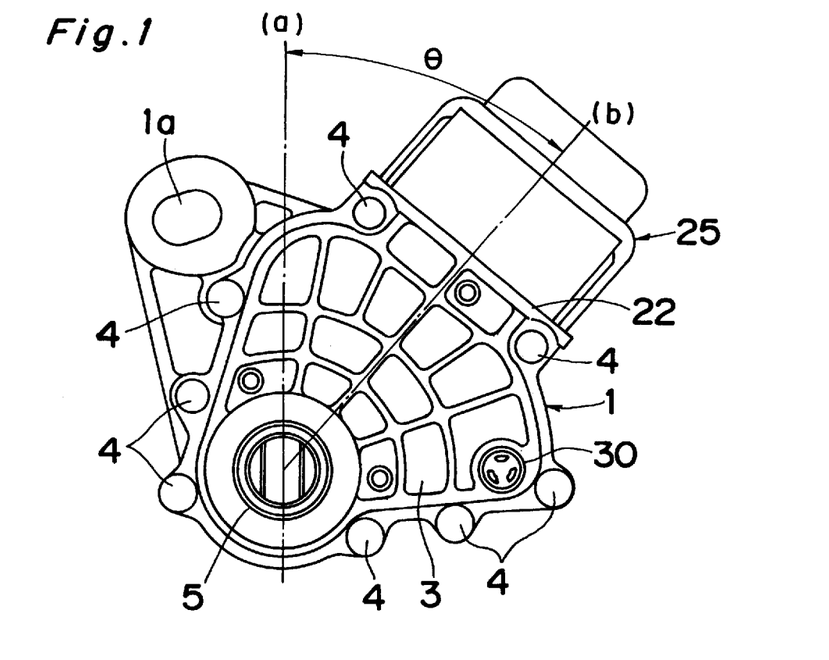
FIG. 1 is a rear view of a control switch of the present invention.
Figure 2:
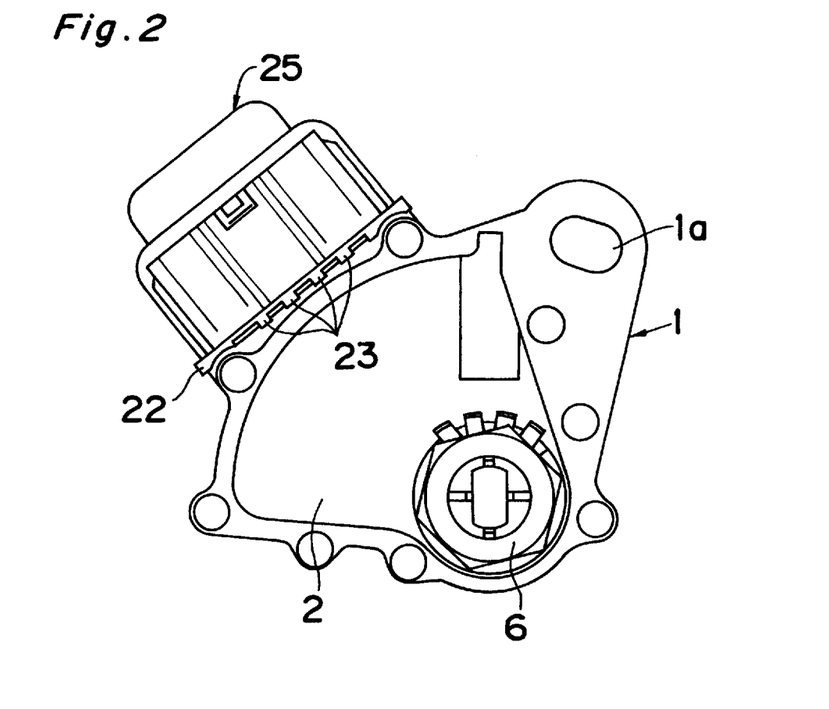
FIG. 2 is a front view of the control switch.
Figure 3:
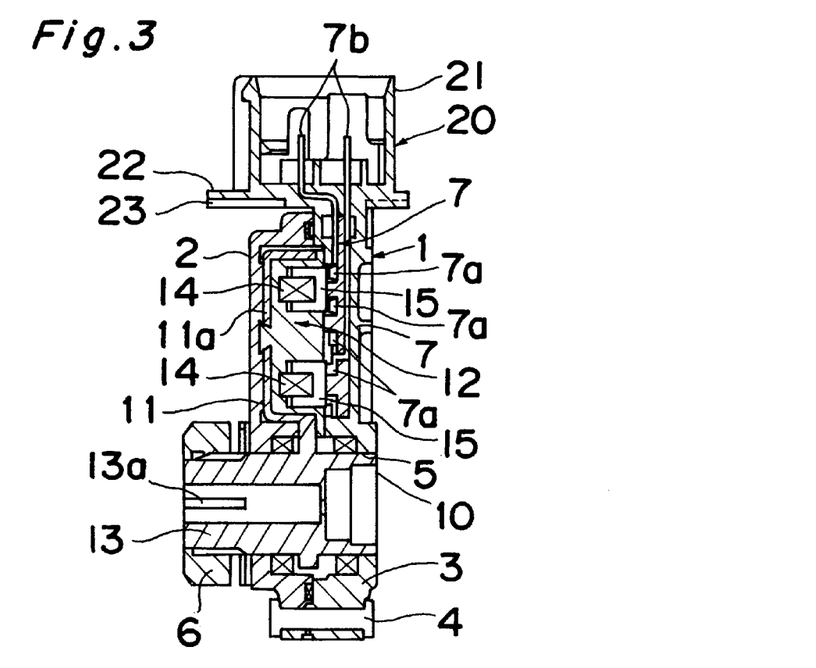
FIG. 3 is a longitudinal sectional view of the control switch.
Figure 5:
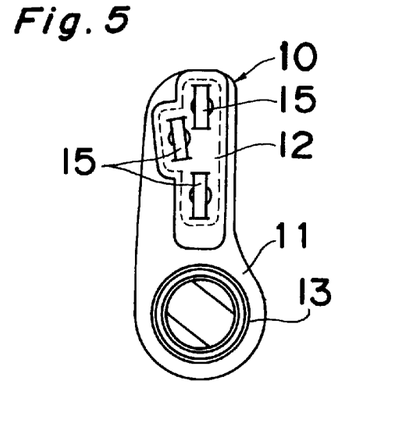
FIG. 5 is a front view of a movable body of the control switch.
Figures 6A, 6B:
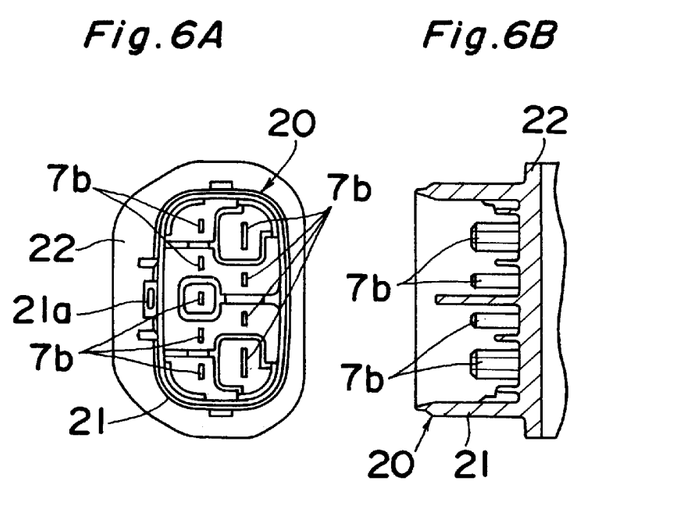
FIG. 6A is an upper view of a connector part.
FIG. 6B is a longitudinal sectional view of the connector part.
Figure 6C:
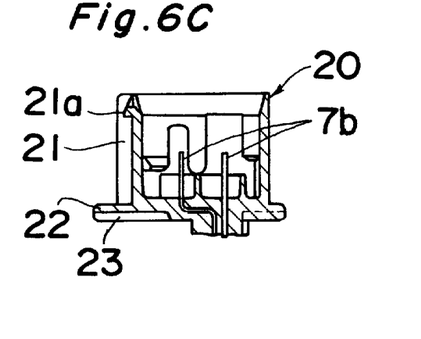
FIG. 6C is a lateral sectional view of the connector part.

Referring to FIG. 3, a die-cast aluminum case 2 and a main body substrate 3 made of a synthetic resin are coupled together by rivets 4, thereby constituting a housing 1. As shown in FIGS. 1 and 2, the housing 1 is of a generally sector-shaped configuration. A movable body 10 is accommodated in the housing 1 so as to be freely rotatable. As indicated in FIG. 5, the movable body 10 comprises a die-cast zinc main body 11 having a cylindrical axial part 13 at one end thereof and a contact holder 12 made of a synthetic resin and securely fitted in a recess 11a formed in the main body 11. The contact holder 12 holds three movable contacts 15 urged towards the front side, as viewed in FIG. 5, by springs 14 (See FIG. 3).

A hole 5 is formed at one corner of the housing 1 (at a pivotal point of the sector-shaped housing 1) into which the axial part 13 of the movable body 10 is rotatably inserted. A fastening nut 6 for coupling a manual shaft 41 to the axial part 13 is clamped at an outer peripheral face of one end of the axial part 13 at the side of the case 2. A cylindrical split groove 13a is formed it a part of the axial part 13 where the fastening nut 6 is clamped. When the manual shaft 41 is inserted into the axial part 13 and the fastening nut 6 is fastened, the split groove 13a is shrunk radially inwardly to firmly connect the manual shaft 41 and the axial part 13 together.

The main body substrate 3 is formed by inserting and preforming a band-shaped conductor 7 having fixed contacts 7a at one end part and subjecting the other part to secondary molding. A connector 20 is provided at the secondary mold part. The fixed contacts 7a are arranged on a plurality of arcs concentric with the center of turn of the axial part 13, so that the fixed contacts are brought into contact and out of contact with the movable contacts 15 in accordance with the turn of the movable body 10.

Figure 4:
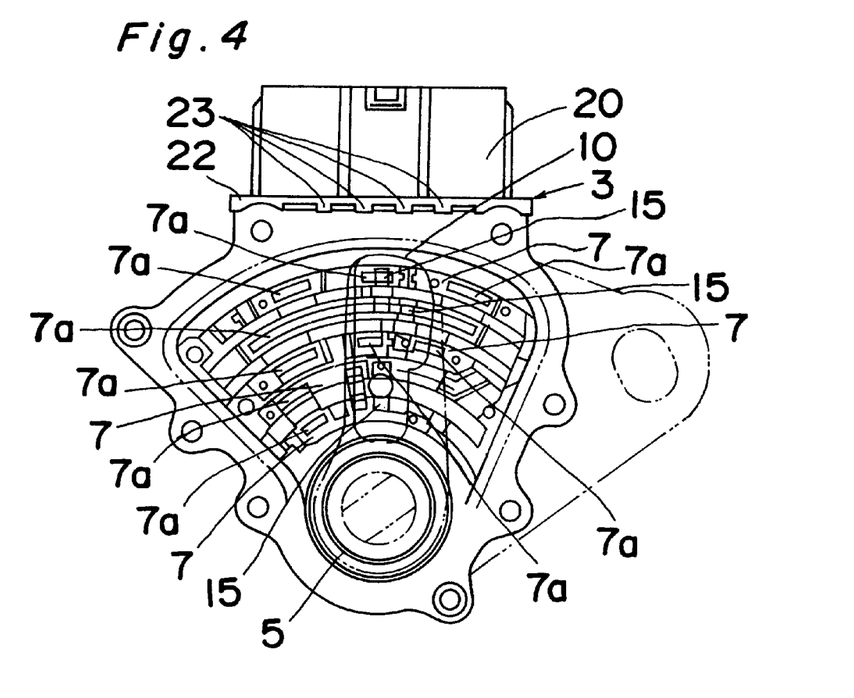
FIG. 4 is a front view of a main body substrate of the control switch.

The connector part 20 has a prism-shaped wall 21 therearound and connector terminals 7b at an inner bottom face thereof The connector terminals 7b are formed by projecting one end part of the conductor, in two rows. On the other hand, a flange part 22 is continuously integrally formed with a base part of the connector part 20. As shown in FIG. 3, the flange part 22 is made larger in size in an axial direction of the axial part 13 than the housing 1. Moreover, a plurality of reinforcing ribs 23 are provided, as shown in FIGS. 2 and 4, at a bottom face (face at the side of the hole 5) of the flange part 22 in a direction parallel to a longitudinal direction of the flange part 22. Because of the plurality of ribs 23, strength of the flange part 22 is secured although the flange part 22 has a small thickness. In FIGS. 1 and 2, the connector part 20 is illustrated in a state coupled to a counterpart connector 25. The counterpart connector 25 is formed in a shape to accommodate the connector part 20 thereinside, and moreover a leading end face of the connector 25 butts against the flange part 22. This structure facilitates waterproof performance at a connecting part between the connector part 20 and connector 25. The movable contacts 15 are selectively brought in touch and electrically connected with one of the fixed contacts 7a in accordance with the position to which the movable body 10 is turned relative to the housing 1, whereby a position signal corresponding to a shift position of of the transmission 50 is taken out via the connector 25 connect ed to the connector part 20.

Figure 7:
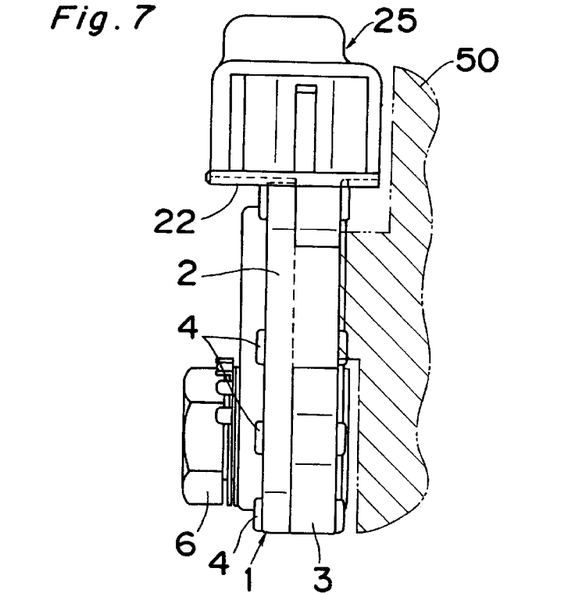
FIG. 7 is a side view of the control switch in a state mounted to an automobile.

For setting the housing 1 to the transmission 50 as indicated in FIG. 7, a screw insertion hole 1a through which a fitting screw is inserted is formed in the housing 1 as shown in FIG. 1. The connector 20 is set so that while the housing 1 is mounted to a regular mounting position of an automobile body, a direction (shown by (b) in FIG. 1) normal to an opening face of the connector part 20 is inclined a predetermined angle θ (preferably 30–60°) relative to a direction (shown by (a) in FIG. 1) normal to a bottom face of the automobile body.

Still referring to FIG. 1, a ventilation hole 30 is opened at a part of the main body substrate 3 facing the transmission 50 and at a lower end part of the housing 1 when the housing is mounted at the regular mounting position of the automobile body. The ventilation hole 30 communicates with a space where the movable body 7 turns in the housing 1. The ventilation hole 30 is formed in a manner to sink from an outer side face of the main body substrate 3. As is clear from FIGS. 9A and 9B, two step parts 31 and 32 are formed circularly in an inner circumferential face of the ventilation hole 30. Each step part has a larger diameter at the side of the outer side face of the main body substrate 3. The step part 32 farther from the outer side face of the main body substrate 3 has an annular projection 32a formed all over the circumference. Accordingly, a large hole part 30a at the opening side and a small hole part 30b are formed via the step part 31 between the step part 32 and the opening face of the ventilation hole 30. A notch 31a is formed at one point in a circumferential direction of the small hole part 30b of the ventilation hole 30 (preferably at a lower end when the housing is mounted at the regular mounting position to the automobile) in a direction parallel to a center line of the ventilation hole 30.

Figure 8A:
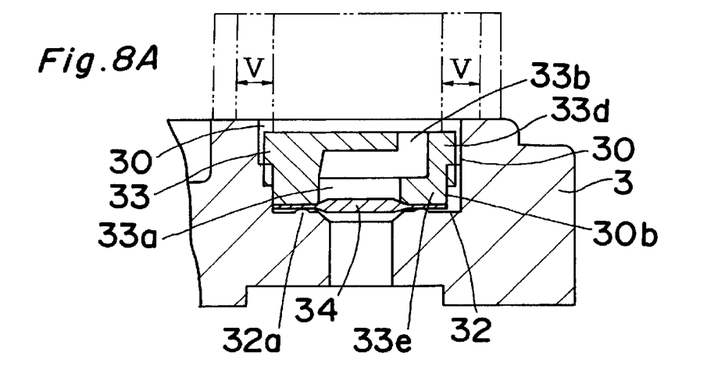
FIG. 8A is a sectional view of a fundamental part of the control switch.
Figure 8B:
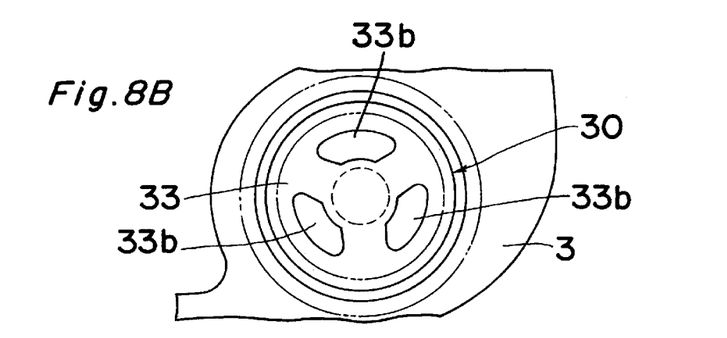
FIG. 8B is a front view of the fundamental part.
Figure 9A:
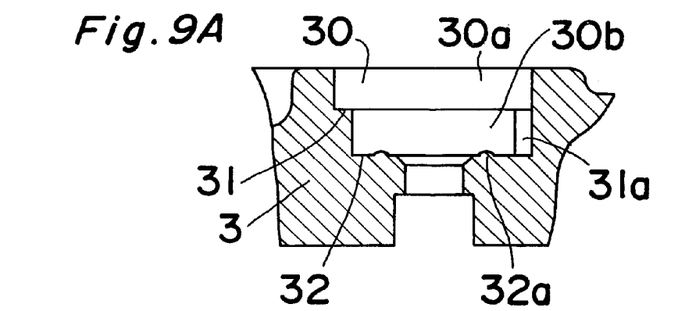
FIG. 9A is a sectional view of a ventilation hole of the control switch.
Figure 9B:
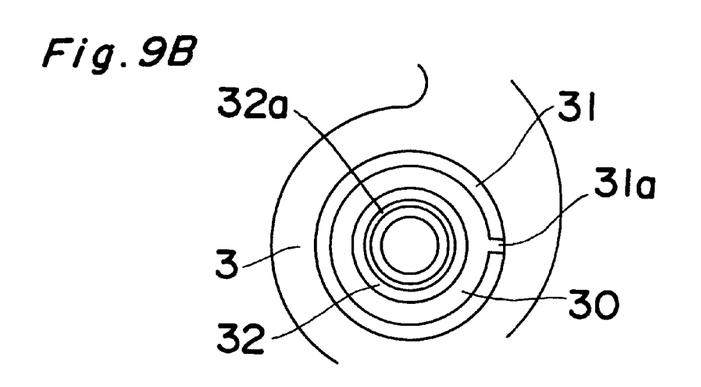
FIG. 9B is a front view of the ventilation hole of the control switch.
Figure 10A:
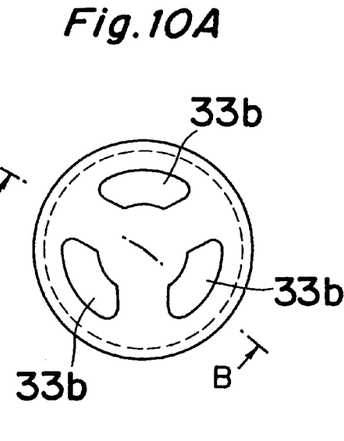
FIG. 10A is a front view a cap used in the control switch.
Figure 10B:
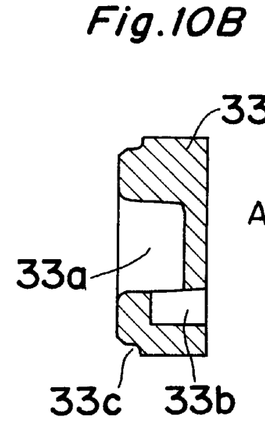
FIG. 10B is a sectional view taken along the line A–B of FIG. 10A.
Figure 10C:
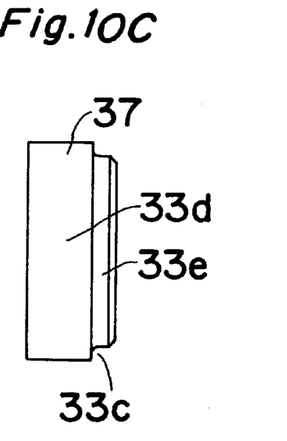
FIG. 10C is a side view of the cap.

In FIGS. 8A and 8B, a cylindrical cap 33 formed of a synthetic resin is fitted in the ventilation hole 30, so that a peripheral part of a filter 34 is held between the step part 32 and the cap 33. The filter 34 is formed of waterproof material having a gas permeability, similar to that used in the prior art. The cap 33 has, as shown in FIGS. 10A to 10C, a recess 33a opening circularly at one face in an axial direction and, ventilation ports 33b opening via an equal distance at a plurality of points (three points in FIGS. 10A to 10C) of a circumferential direction at the other face in the axial direction to communicate with a circumferential face of the recess 33a. The cap 33 is set to the main body substrate 3 not to project from the main body substrate 3. That is, no part projects in the main body substrate 3, thus never adversely influencing the mounting of the main body substrate 3 to the transmission 50. The ventilation port 33b is a long hole curving along the circumferential direction of the cap 33. An outer diameter of the cap is set so that one end part is inserted between the step parts 31 and 32 of the ventilation hole 30, and the other end part is inserted between the step part 31 and the opening face of the ventilation hole 30. In other words, when the cap 33 is fitted to the ventilation hole 30, a step part 33c overlapping with the step part 31 is formed at the outer circumferential face of the cap 33, and also a large diameter part 33d and a small diameter part 33e to be inserted into the large hole part 30a and small hole part 30b of the ventilation hole 30 respectively art formed. For effecting this arrangement, a size relationship is set to make a gap between the large diameter part 33d of the cap 33 and large hole part 30a of the ventilation hole 30 larger than a gap between the small diameter part 33e and small hole part 30b.

Figure 11A:
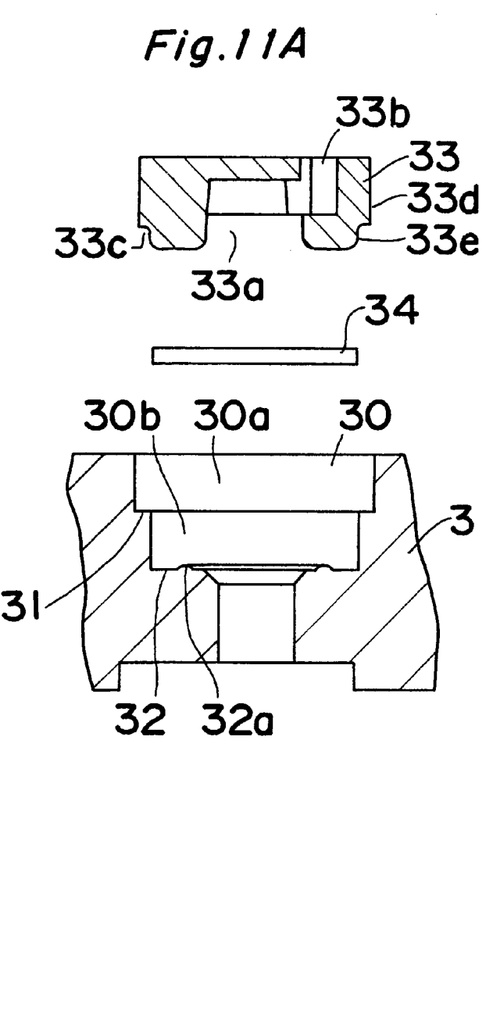
FIGS. 11A to 11C are a diagram the sequence of assemblage.
Figure 11B:
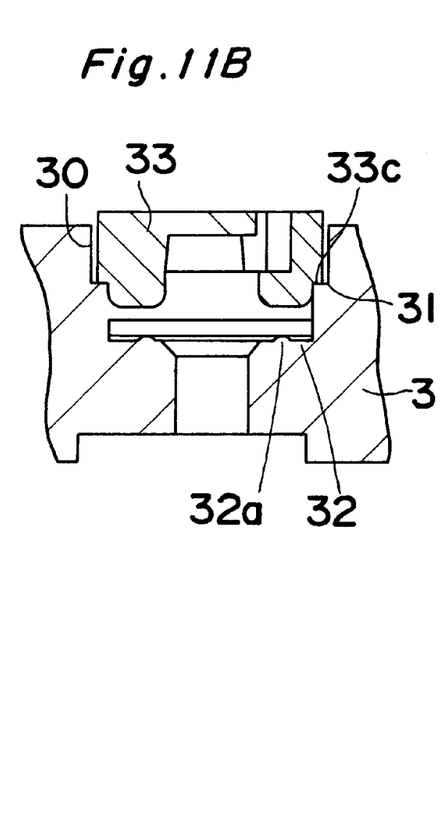
Figure 11C:
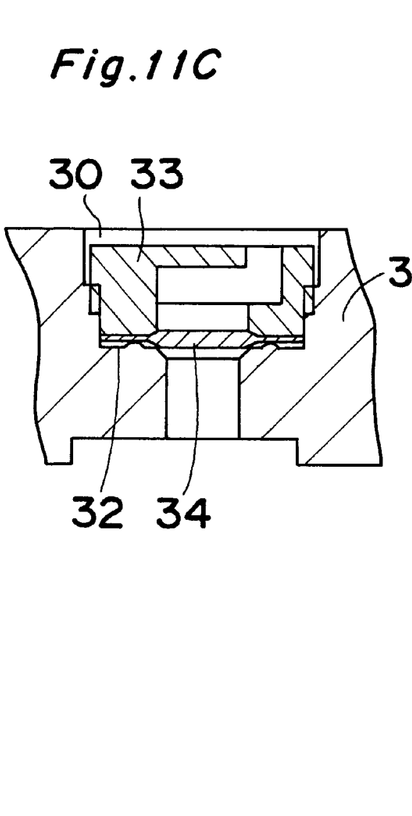

When the filter 34 is to be attached to the ventilation hole 30, as shown in FIGS. 11A and 11B, the filter 34 and cap 33 are sequentially dropped into the ventilation hole 30, then the step part 33c of the cap 33 is loaded on the step part 31 of the ventilation hole 30, and an ultrasonic thermocompression bonding is conducted. As a result, parts corresponding to the step parts 31 and 33c are thermally bonded to overlap with each other, as shown in FIG. 11C. More specifically, the large diameter part 33d of the cap 33 is thermally bonded to the small hole part 30b of the ventilation hole 30. The cap 33 is thermally bonded to the main body substrate 3 in the whole circumference, whereby the filter 34 is fitted water-tightly by the main body substrate 3 and the cap 33. When the filter 34 is held between the cap 33 and step part 32, the annular projection 32a alike is thermally bonded to the filter 34. Since an inner diameter of the ventilation hole 30 and an outer diameter of the cap 33 are kept in the above-described size relationship, a flash even if brought about during the ultrasonic thermocompression bonding is easily taken outside through the gap of the opening of the ventilation hole 30 to the cap 33. Therefore, the sealing performance between the main body substrate 3 and cap 33 at the time of the ultrasonic thermocompression bonding is restricted not to vary. The flash is discharged also through the notch 31a The notch 31a works as an air vent when the cap 33 is fitted to the ventilation hole 30. In comparison with the prior art constitution requiring sealing at two points, the present invention is satisfactory with a simple sealing between the main body substrate 3 and cap 33, thereby enabling quality control with ease. Moreover, since the sealing performance is determined by an insertion depth of the cap 33 to the ventilation hole 30, the sealing efficiency is improved if the insertion depth is increased, and enhanced more as compared with that by the caulking method in the prior art. Since the insertion depth of the cap 33 into the ventilation hole 30 can be directly adjusted by an ultrasonic thermocompression bonding apparatus, the filter 34 can be surely held between the step part 32 of the ventilation hole 30 and the cap 33. In addition, the interval between the step part 32 of the ventilation hole 30 and the cap 33, namely, the pressed amount of the peripheral part of the filter 34 can be managed simply by confirming the insertion depth of the cap 33 without using a sample and breaking the main body substrate of the sample. Since the ventilation hole 30 is formed in the main body substrate 3 as the synthetic resin mold, the formation of the ventilation hole 30 becomes easy.

In order to test the sealing performance, a press member is arranged as indicated by a double dashed-line in FIG. 8A to drive an air pressure through a vent hole denoted by an arrow V to the circumferential part of the ventilation hole 30. Since the main body substrate 3 and the cap 33 are thermally bonded, a pressing force at the test does not work to the filter 34, and consequently there is no possibility that the sealing performance may be confirmed wrong. Further, as is apparent from the above-described constitution, the cap 33 exerts both a holding function and a protecting function to the filter 34 and is directly bonded to the main body substrate 3 with heat, so that the waterproof efficiency of the ventilation hole 30 is secured simply by the cap 33 and filter 34. A count of parts is reduced in comparison with the prior art.

Figures 12A, 12B:
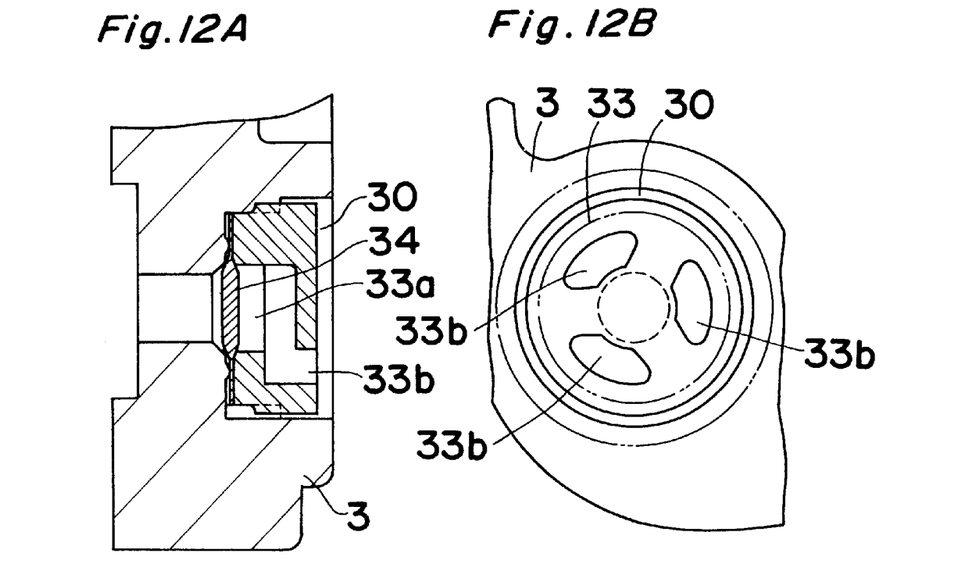
FIG. 12A is a sectional view of a fundamental part.
FIG. 12B is a front view of the fundamental part.

Since the ventilation hole 30 are opened at one face of the main body substrate 3 opposite to the transmission 50, naturally the water and mud are difficult to enter through the ventilation hole 30. In addition, since the ventilation hole 30 are located at the part which becomes the lowest end of the housing 1 when the housing 1 is mounted at the regular position of the automobile, the water is easily taken outside even if entering the housing 1. Besides, since the ventilation ports 33b are formed via the equal distance in the circumferential direction of the cap 33 and in the shape of a long arc along the circumferential direction of the cap 33, any of the ventilation ports 33b is positioned below the ventilation hole 30 (any of the ventilation ports 33b is opened lower than the recess 33a) as shown in FIGS. 12A and 12B even when the cap 33 is turned in the circumferential direction when fitted, and therefore the ventilation ports 33b function as a water vent. In other words, the cap 33 can be set in any direction, facilitating an assembly work.

Figure 13A:
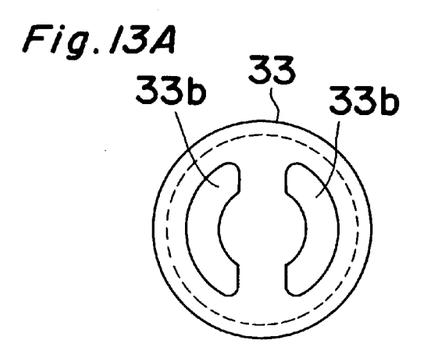
FIG. 13A is a front view of other cap.
Figure 13B:
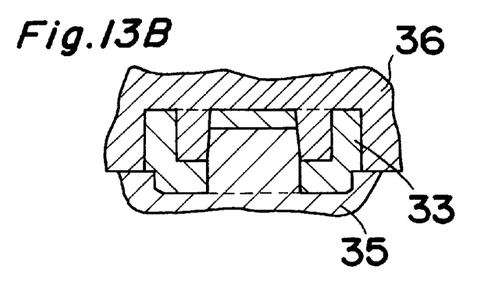
FIG. 13B is a sectional view of molds for forming the cap.
Figure 14A:
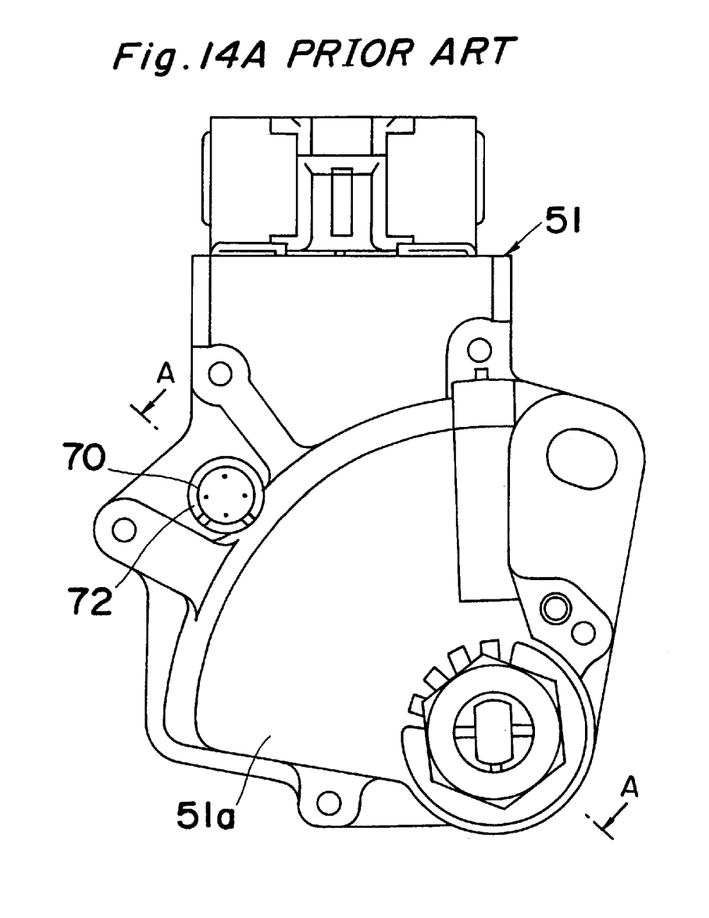
FIG. 14A is a front view of the prior art control switch.
Figure 14B:
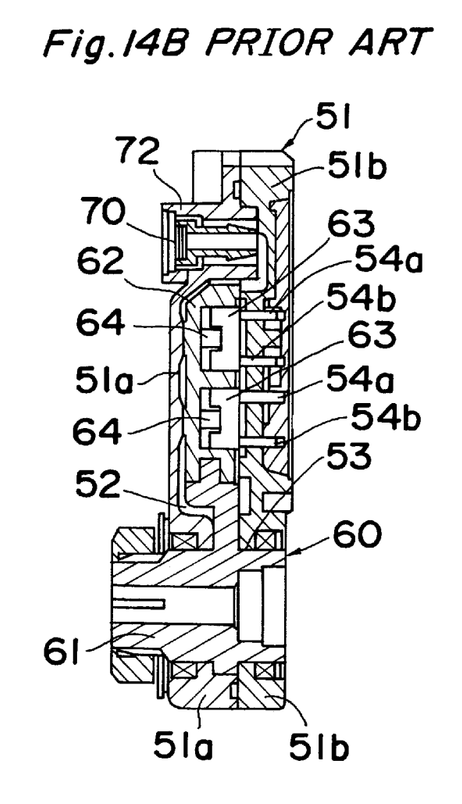
FIG. 14B is a sectional view taken along the line A—A of FIG. 14A.
Figure 15:
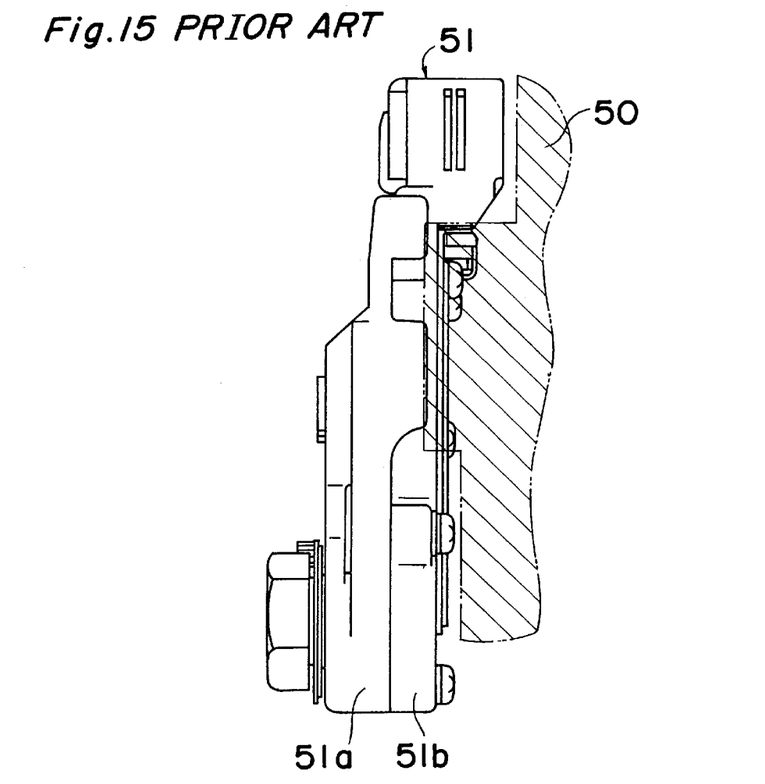
FIG. 15 is a side view of the prior art control switch mounted on an automobile body.
Figure 16:
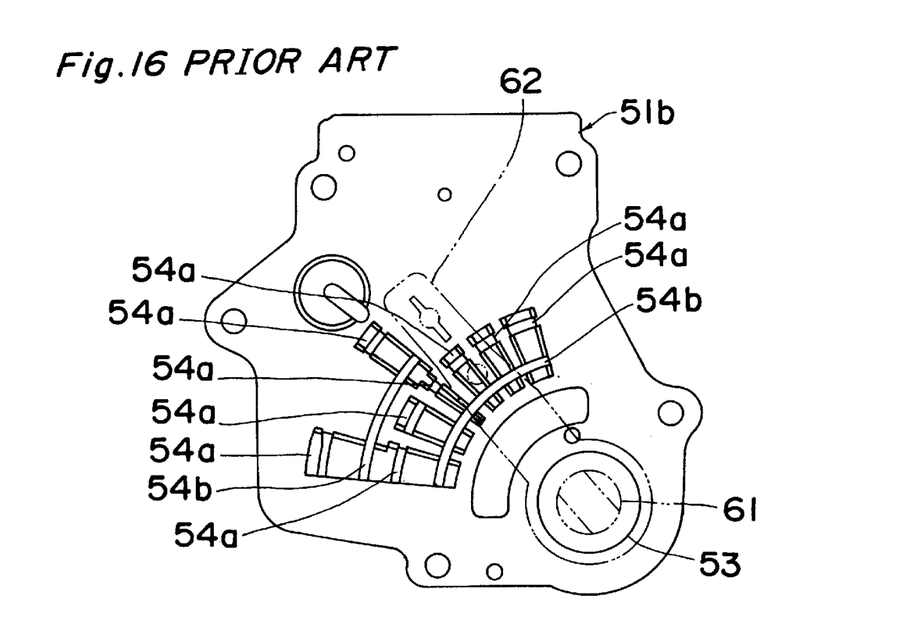
FIG. 16 is a front view of a main body substrate in the prior art control switch.

So long as a plurality of ventilation ports 33b are formed, a count of the ventilation ports 33b is not particularly specified. The cap 33 may be provided with two ventilation ports 33b, as in FIG. 13A. The cap 33 of FIG. 13A is obtained easily by forming the recess 33a with a lower mold 35 and the ventilation ports 33b with an upper mold 36. Also a plurality of notches 31 a may be arranged, not limited to one notch, and a plurality of annular projections 32a may be provided as well.

What is claimed is:

1. A control switch for an automatic vehicle transmission, said control switch comprising:

a movable body that turns in association with an operation of a gearshift lever of said automatic vehicle transmission provided in a vehicle;

a housing receiving said movable body and having fixed contacts adapted to be brought into and out of engagement with movable contacts in response to a turn of said movable body;

a position of said fixed contacts indicating a shift position of said automatic vehicle transmission;

wherein a ventilation hole communicating from an interior to an exterior of said housing is provided at a side face of said housing where said housing is mounted to the vehicle, said ventilation hole being provided in a vicinity of a lower end part of said housing when said control switch is mounted to the vehicle; and said ventilation hole comprises a step part which has a larger diameter at an interior side than at an exterior side, so that a peripheral part of a filter of gas-permeable waterproof material is held between a gas-permeable cap inserted in said ventilation hole and said step part.

2. A control switch for an automatic vehicle transmission according to claim 1, wherein said housing comprises a main body substrate molded of a synthetic resin and providing a mount face to said automobile and a metallic case forming a space in cooperation with said main body substrate for accommodating said movable body therein, wherein said ventilation hole is opened in said main body substrate.

3. A control switch for an automatic vehicle transmission according to claim 1, wherein said cap is molded a synthetic resin, having at least an outer circumferential face being thermocompression bonded with use of ultrasonic waves to an inner circumferential face of said ventilation hole inside said ventilation hole.

4. A control switch for an automatic vehicle transmission according to claim 3, wherein a large hole part and a small hole part are formed between an opening face and said step part of said ventilation hole so that a diameter of said large hole part at said side of said opening face is larger, while said cap has a large diameter part to be inserted in said large hole part and a small diameter part to be inserted in said small hole part, with a circumferential wall of said small hole part of said ventilation hole being thermocompression bonded with ultrasonic waves to said large diameter part of said cap, said control switch further characterized in that a gap between said large hole part and large diameter part is set larger than that between said small hole part and small diameter part.

5. A control switch for an automatic vehicle transmission according to claim 3, wherein a notch is formed at least at one point of an inner circumferential face of said small hole part of said ventilation hole in a direction parallel to a center line of said ventilation hole.

6. A control switch for an automatic vehicle transmission according to claim 1, wherein said cap has a cylindrical recess at a central part opposite to said filter and is so shaped that ventilation ports are opened at said opening side of said ventilation hole to communicate to said recess.

7. A control switch for an automatic vehicle transmission according to claim 6, wherein said ventilation port is a long arc hole curved in a circumferential direction of said cap and provided by a plurality of counts via an equal distance.

8. A control switch for an automatic vehicle transmission according to claim 1, wherein said cap is disposed at an inner side than said opening face of said ventilation hole.

9. A control switch for an automatic vehicle transmission comprising:

a movable body turning in association with an operation of a gear shift lever of said automatic vehicle transmission provided in an automobile;

a housing storing said movable body and having fixed contacts to be brought in and out of engagement with movable contacts in response to said turn of said movable body;

thereby indicating a shift position of said automatic vehicle transmission in accordance with a position of said fixed contacts;

wherein a ventilation hole communicating interior to exterior of said housing is opened at a face at a side of said housing where said housing is mounted to said automobile, said ventilation hole comprising a step part which has a larger diameter at an opening side, so that a peripheral part of a filter of gas-permeable waterproof material is held between a gas-permeable cap inserted in said ventilation hole and said step part.

10. A control switch for an automatic vehicle transmission according to claim 9, wherein said cap is molded a synthetic resin, having at least an outer circumferential face being thermocompression bonded with use of ultrasonic waves to an inner circumferential face of said ventilation hole inside said ventilation hole.

11. A control switch for an automatic vehicle transmission according to claim 10, wherein a large hole part and a small hole part are formed between an opening face and said step part of said ventilation hole so that a diameter of said large hole part at said side of said opening face is larger, while said cap has a larger diameter part to be inserted in said large hole part and a small diameter part to be inserted in said small hole part, with a circumferential wall of said small hole part of said ventilation hole being thermocompression bonded with ultrasonic waves to said large diameter part of said cap, said control switch further characterized in that a gap between said large hole part and large diameter part is set larger than that between said small hole part and small diameter part.

12. A control switch for an automatic vehicle transmission according to claim 10, wherein a notch is formed at least at one point of an inner circumferential face of said small hole part of said ventilation hole in a direction parallel to a center line of said ventilation hole.

13. A control switch for an automatic vehicle transmission according to claim 9, wherein said cap has a cylindrical recess at a central part opposite to said filter and is so shaped that ventilation ports are opened at said opening side of said ventilation hole to communicate to said recess.

14. A control switch for an automatic vehicle transmission according to claim 13, wherein said ventilation port is a long arc hole curved in a circumferential direction of said cap and provided by a plurality of counts via an equal distance.

15. A control switch for an automatic vehicle transmission according to claim 9, wherein said cap is disposed at an inner side than said opening face of said ventilation hole.

* * * * *